US012494758B2

(12) United States Patent
Cheng et al.

(10) Patent No.: US 12,494,758 B2
(45) Date of Patent: Dec. 9, 2025

(54) RESONANCE CIRCUIT AND FILTERING DEVICE

(71) Applicant: ANHUI ANUKI TECHNOLOGIES CO., LTD., Anhui (CN)

(72) Inventors: Wei Cheng, Anhui (CN); Lijie Dai, Anhui (CN); Chengjie Zuo, Anhui (CN); Jun He, Anhui (CN)

(73) Assignee: ANHUI ANUKI TECHNOLOGIES CO., LTD., Hefei (CN)

( * ) Notice: Subject to any disclaimer, the term of this patent is extended or adjusted under 35 U.S.C. 154(b) by 461 days.

(21) Appl. No.: 17/919,246

(22) PCT Filed: Mar. 9, 2021

(86) PCT No.: PCT/CN2021/079814
§ 371 (c)(1),
(2) Date: Oct. 14, 2022

(87) PCT Pub. No.: WO2021/213040
PCT Pub. Date: Oct. 28, 2021

(65) Prior Publication Data
US 2023/0170869 A1 Jun. 1, 2023

(30) Foreign Application Priority Data
Apr. 21, 2020 (CN) .......................... 202010315283.4

(51) Int. Cl.
*H03H 7/01* (2006.01)
(52) U.S. Cl.
CPC ........ *H03H 7/0115* (2013.01); *H03H 7/0161* (2013.01)
(58) Field of Classification Search
CPC ...... H03H 7/0115; H03H 7/0138; H03H 7/01; H03H 7/0161
USPC ........................................ 333/175, 167, 176
See application file for complete search history.

(56) References Cited

U.S. PATENT DOCUMENTS 4,395,688 A * 7/1983 Sellers ................. H03H 7/1791
333/176
2003/0025566 A1* 2/2003 Rogers ................. H03B 5/1262
331/109
(Continued)

FOREIGN PATENT DOCUMENTS

CN 1128585 A 8/1996
CN 105580274 A 5/2016
(Continued)

OTHER PUBLICATIONS

International Search Report issued in related PCT Application No. PCT/CN2021/079814, mailed on Jun. 7, 2021, in 2 pages.
(Continued)

*Primary Examiner* — Stephen E. Jones
(74) *Attorney, Agent, or Firm* — Davis Wright Tremaine LLP

(57) ABSTRACT

A resonance circuit and a filtering device, which relate to the technical field of electronic devices. The resonance circuit includes: a connection port, wherein the connection port includes a first port and a second port; and a resonance unit, wherein the resonance unit includes at least one inductor element and at least one capacitor element, and the inductor element is connected to the capacitor element. The first port and the second port are respectively connected to the resonance unit, so as to form at least two branches which are connected in parallel, and at least one of the first port and the second port is not connected to any of the capacitor elements.

7 Claims, 6 Drawing Sheets

(56) References Cited

U.S. PATENT DOCUMENTS

2018/0375503 A1* 12/2018 Lin ..................... H02M 1/38
2018/0375504 A1   12/2018 Lin et al.

FOREIGN PATENT DOCUMENTS

| CN | 111404510  | A  |   | 7/2020  |         |          |
|----|------------|----|---|---------|---------|----------|
| CN | 211606503  | U  |   | 9/2020  |         |          |
| JP | H05243989  | A  | * | 11/1991 | ........... | H03L 7/099 |
| JP | 2019009645 | A  |   | 1/2019  |         |          |
| WO | 2015045794 | A1 |   | 4/2015  |         |          |

OTHER PUBLICATIONS

Japan Patent Office, "Notice of Reasons for Refusal" in Application No. 2022-563163, Oct. 24, 2023, 4 pages.
The State Intellectual Property Office of People's Republic of China, Application No. 202010315283.4, Dec. 12, 2024, 11 pages.
Japan Patent Office, "Notice of Reasons for Refusal" in Application No. 2022-563163, Mar. 7, 2024, 8 pages.
Japan Patent Office, "Decision of Refusal" in Application No. 2022-563163, Jul. 23, 2024, 4 pages.
The State Intellectual Property Office of People's Republic of China, Application No. 202010315283.4, Jul. 1, 2025, 9 pages.
The State Intellectual Property Office of People's Republic of China, Application No. 202010315283.4, Aug. 27, 2025, 10 pages.
Korean Intellectual Property Office, "Request for the Sumbission of an Opinion", in Application No. 10-2022-7036711, Jun. 20, 2024, 11 pages.
The State Intellectual Property Office of People's Republic of China, Application No. 202010315283.4, Apr. 21, 2020, 4 pages.

* cited by examiner

--Prior Art--

--Prior Art--

--Prior Art--

# RESONANCE CIRCUIT AND FILTERING DEVICE

CROSS-REFERENCE TO RELATED APPLICATIONS

The present disclosure is a 371 U.S. National Phase of International Patent Application No. PCT/CN2021/079814, filed Mar. 9, 2021, entitled "RESONANCE CIRCUIT AND FILTERING DEVICE," which claims priority to Chinese Patent Application No. 202010315283.4, filed Apr. 21, 2020, entitled "RESONANCE CIRCUIT AND FILTERING DEVICE," the contents of which are incorporated herein by reference in their entirety.

TECHNICAL FIELD

The present disclosure relates to the technical field of electronic devices, and in particular, to a resonance circuit and a filtering device.

BACKGROUND ART

In the design of filtering devices, in order to obtain a certain out-of-band rejection, transmission zero point is generally generated by the resonance circuit. In the above, the parallel resonance circuit composed of capacitors and inductors is widely used in filtering devices.

However, in some applications of the existing capacitor-inductor parallel resonance circuit, due to the limitation of the difficulty of making the capacitor larger, there is a problem that it is difficult to obtain a higher out-of-band rejection at a frequency position near the transmission zero point.

SUMMARY

In view of this, the present disclosure provides a resonance circuit and a filtering device to solve the problem of the existing resonance circuit that it is difficult to obtain a higher out-of-band rejection at a frequency position near a transmission zero point due to the limitation of the difficulty of making the capacitor larger.

The embodiments of the present disclosure adopt the following technical solutions.

A resonance circuit, which comprises:
  a connection port, wherein the connection port comprises a first port and a second port; and
  a resonance unit, wherein the resonance unit comprises at least one inductor element and at least one capacitor element, and the inductor element is connected to the capacitor element,
  wherein the first port and the second port are respectively connected to the resonance unit, so as to form at least two branches connected in parallel, and at least one of the first port and the second port is not connected to any of capacitor elements.

Optionally, in the above resonance circuit, the first port is connected between one inductor element and one capacitor element, the second port is connected to at least one inductor element, and is not connected to any of capacitor elements.

Optionally, in the above resonance circuit, the first port is connected to at least one inductor element, and is not connected to any of capacitor elements, and the second port is connected to at least one inductor element, and is not connected to any of capacitor elements.

Optionally, in the above resonance circuit, a port not connected to any of capacitor elements is connected between two inductor elements.

Optionally, in the above resonance circuit, the port not connected to any of capacitor elements is connected between two adjacent different parts of one inductor element, so that two adjacent different parts respectively belong to the two branches connected in parallel.

Optionally, in the above resonance circuit, the at least one inductor element and the at least one capacitor element are in sequence connected end to end to form a closed ring circuit,
  wherein the first port and the second port are connected to different positions of the ring circuit to form two branches connected in parallel.

Optionally, in the above resonance circuit, the resonance unit comprises one inductor element and one capacitor element, and the inductor element and the capacitor element are connected end to end to form a closed ring circuit.

Optionally, in the above resonance circuit, sum of numbers of the inductor elements and the capacitor elements is greater than or equal to three.

Optionally, in the above resonance circuit, the resonance unit comprises two or more inductor elements and two or more capacitor elements.

Optionally, in the above resonance circuit, the inductor element comprises adjacent first part and second part,
  wherein the first port is connected between the inductor element and the capacitor element, and the second port is connected between the first part and the second part, so that the first part and the second part respectively belong to the two branches connected in parallel.

Optionally, in the above resonance circuit, the inductor element comprises a first part, a second part and a third part which are adjacent in sequence,
  wherein the first port is connected between the first part and the second part, and the second port is connected between the second part and the third part, so that the first part, the capacitor element and the third part are connected in series and connected in parallel with the second part.

Optionally, in the above resonance circuit, the first port serves as an input port of the resonance circuit, and the second port serves as an output port of the resonance circuit.

Based on the above, embodiments of the present disclosure further provide a filtering device, which includes a plurality of the above-mentioned resonance circuits, and the plurality of resonance circuits are respectively connected through connection ports.

Optionally, in the above filtering device, each of resonance units has different compositions to respectively generate different resonance frequencies, thereby forming a band-pass filter.

Optionally, in the above filtering device, the plurality of resonance circuits are connected in series, or in parallel, or both in series and in parallel.

Figure 1:
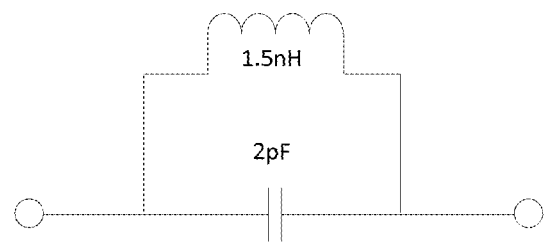
FIG. 1 is an existing parallel resonance circuit.

Reference signs in drawings: 10—filtering device; 100—resonance circuit; 110—connection port; 111—first port; 113—second port; 130—resonance unit; 131—inductor element; 131a—first part; 131b—second part; 131c—third part; 133—capacitor element; L1—first inductor; L2—second inductor; C1—first capacitor.

DETAILED DESCRIPTION OF EMBODIMENTS

In order to make the purposes, technical solutions and advantages of the embodiments of the present disclosure clearer, the technical solutions in the embodiments of the present disclosure will be clearly and completely described below with reference to the drawings in the embodiments of the present disclosure, obviously, the embodiments described are only part of the embodiments of the present disclosure, rather than all embodiments. The components of the embodiments of the present disclosure, which are generally described and shown in the drawing herein, may be arranged and designed in a variety of different configurations.

Therefore, the following detailed description of the embodiments of the present disclosure provided in the drawings is not intended to limit the claimed scope of the present disclosure, but merely represents selected embodiments of the present disclosure. Based on the embodiments of the present disclosure, all other embodiments obtained by those ordinarily skilled in the art, without making inventive effort, fall within the protection scope of the present disclosure.

As shown in FIG. 1, it is an existing parallel resonance circuit, wherein the parallel resonance circuit includes a capacitor (capacitance value may be 2 pF) and an inductor (inductance value may be 1.5 nH), and the capacitor is connected in parallel with the inductor, and the resonance frequency that can be generated is about 2.9 GHz.

Figure 2:
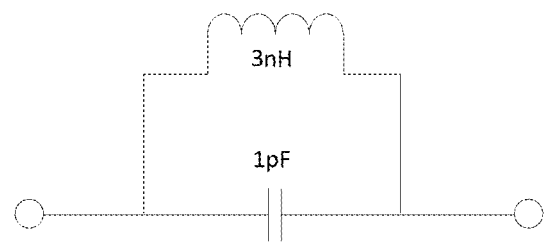
FIG. 2 is another existing parallel resonance circuit.

As shown in FIG. 2, it is another existing parallel resonance circuit, wherein the parallel resonance circuit includes a capacitor (capacitance value may be 1 pF) and an inductor (inductance value may be 3 nH), and the capacitor is connected in parallel with the inductor, and the resonance frequency that can be generated is about 2.9 GHz.

Figure 3:
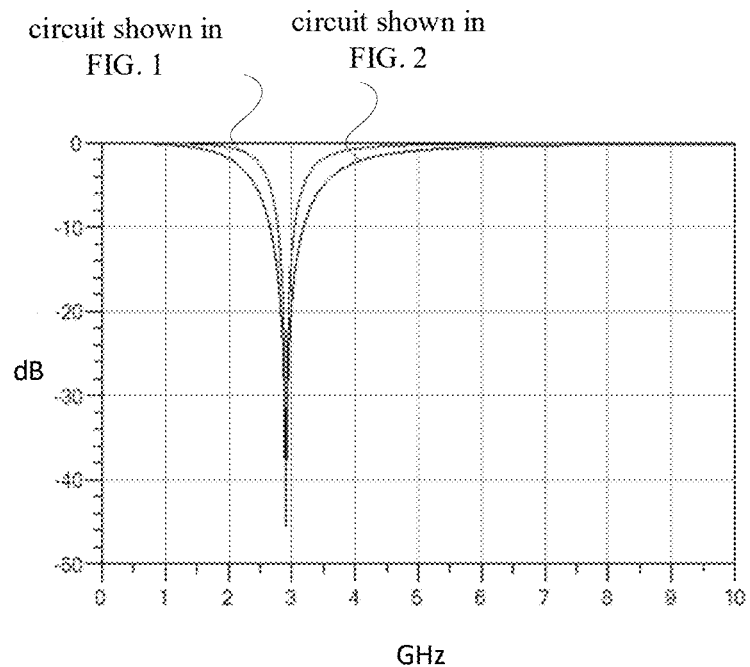
FIG. 3 is a schematic view of resonance performance curves of two parallel resonance circuits shown in FIG. 1 and FIG. 2.

As shown in FIG. 3, it is a schematic view of simulation results of resonance performance of the two parallel resonance circuits shown in FIG. 1 and FIG. 2. It can be seen that the resonance frequencies of the two parallel resonance circuits are the same, however, the parallel resonance circuit shown in FIG. 1 can be used to generate a higher out-of-band rejection (with a steeper sideband) at a frequency position near a transmission zero point, but larger capacitor is required, which makes the application environment restricted; and when the parallel resonance circuit shown in FIG. 2 is used, capacitor with smaller capacitance value may be used, which makes the application environment less restricted, but out-of-band rejection generated at the frequency position near the transmission zero point is lower.

In order to solve the above technical problems, the present disclosure proposes a technical solution that is different from changing the inductance value and capacitance value. In this technical solution, the position of the port is adjusted, so that higher out-of-band rejection at the frequency position near the transmission zero point can be obtained under the condition of using capacitors with the same capacitance value and generating the same resonance frequency, or the same out-of-band rejection at the frequency position near the transmission zero point can be obtained under the condition of using capacitors with the less capacitance values and generating the same resonance frequency.

Figure 4:
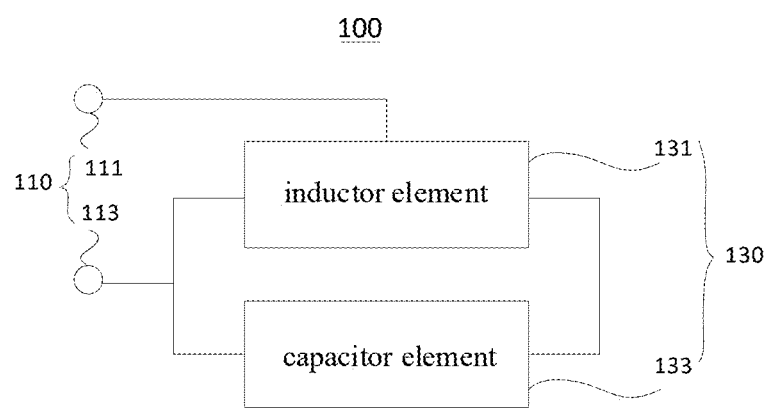
FIG. 4 is a schematic view of a port connection of the resonance circuit provided by an embodiment of the present disclosure.

Based on this, embodiments of the present disclosure provide a resonance circuit 100. In the above, as shown in FIG. 4, the resonance circuit 100 may include a connection port 110 and a resonance unit 130.

In detail, the connection port 110 may include a first port 111 and a second port 113. The resonance unit 130 may include at least one inductor element 131 and at least one capacitor element 133, and the inductor element 131 may be connected with the capacitor element 133.

Furthermore, the first port 111 and the second port 113 are respectively connected to the resonance unit 130 to form at least two branches connected in parallel, and at least one of the first port 111 and the second port 113 is not connected to any of capacitor elements 133.

Based on the above-mentioned arrangement in which at least one port is not connected to the capacitor element 133, compared with the arrangement in which each of ports is connected to the capacitor element 133 in the prior art, higher out-of-band rejection at the frequency position near the transmission zero point can be obtained under the condition of using capacitors with the same capacitance value and generating the same resonance frequency, or the same out-of-band rejection at the frequency position near the transmission zero point can be obtained under the condition of using capacitors with the less capacitance values and generating the same resonance frequency, so as to solve the problem of the existing resonance circuit that it is difficult to obtain a higher out-of-band rejection at a frequency position near a transmission zero point due to the limitation of the difficulty of making the capacitor larger.

It should be noted for the connection port 110 that the specific functions of the first port 111 and the second port 113 included in the connection port 110 are not limited, and can be selected according to actual application requirements.

For example, in an optional example, the first port 111 may serve as an input port of the resonance circuit 100, and the second port 113 may serve as an output port of the resonance circuit 100. In this way, the signal to be processed can be input through the first port 111, and then output through the second port 113 after being processed by the resonance unit 130.

For another example, in another optional example, the first port 111 may serve as an output port of the resonance circuit 100, and the second port 113 may serve as an input port of the resonance circuit 100. In this way, the signal to be processed can be input through the second port 113, and then output through the first port 111 after being processed by the resonance unit 130.

Furthermore, it should be noted for the connection port 110 that the specific connection relationship between the first port 111 and the second port 113 included in the connection port 110 and the resonance unit 130 is also not limited, and can be selected according to actual application requirements.

For example, in an optional example, one of the first port 111 and the second port 113 is connected to at least one inductor element 131, and the port is not connected to any of capacitor elements 133, and the other port may be connected between one inductor element 131 and one capacitor element 133.

In detail, in a specific application example, as shown in FIG. 4, the second port 113 may be connected between one inductor element 131 and one capacitor element 133, the first port 111 may be connected to at least one inductor element 131, and not connected to any of capacitor elements 133.

For another example, in another optional example, both the first port 111 and the second port 113 are connected to at least one inductor element 131, and the ports are not connected to any of capacitor elements 133.

Figure 5:
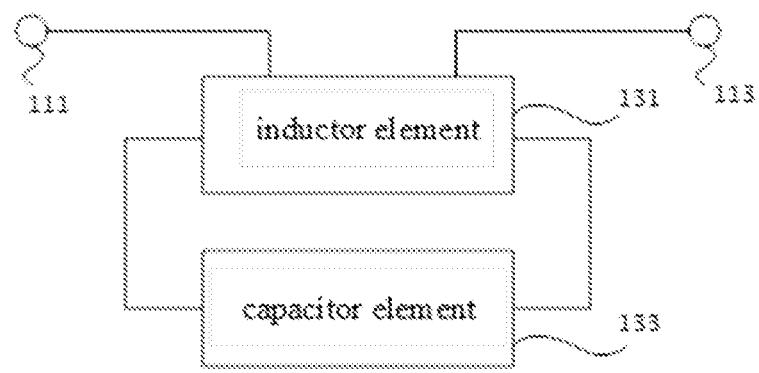
FIG. 5 is a schematic view of another port connection of the resonance circuit provided by an embodiment of the present disclosure.

In detail, in a specific application example, as shown in FIG. 5, the first port 111 may be connected to at least one inductor element 131 and not connected to any of capacitor elements 133, and the second port 113 may be connected to at least one inductor element 131, and not connected to any of capacitor elements 133.

It can be understood that, for ports that are not connected to any of capacitor elements 133 (such as the above-mentioned first port 111 and second port 113), the ports need to be connected to at least one inductor element 131, similarly, the specific connection relationship between the ports and the inductor element 131 is also not limited, and can be selected according to actual application requirements.

For example, in an optional example, a port that is not connected to any of capacitor elements 133 may be connected between two inductor elements 131.

That is to say, in the above example, the resonance unit 130 may include at least two inductor elements 131, and the at least two inductor elements 131 include two inductor elements 131 that are connected adjacently.

For another example, in another optional example, a port that is not connected to any of capacitor elements 133 may be connected between two adjacent different parts of one inductor element 131, so that the adjacent two different parts respectively belong to the two branches connected in parallel.

That is to say, in the above example, the resonance unit 130 may include at least one inductor element 131, and one inductor element 131 among the at least one inductor element 131 may include two adjacent different parts.

It should be noted for the resonance unit 130 that the specific numbers of the inductor elements 131 and the capacitor elements 133 included in the resonance unit 130 are not limited, and can be selected according to actual application requirements.

For example, in an optional example, the resonance unit 130 may include one inductor element 131 and one capacitor element 133. In this way, the inductor element 131 and the capacitor element 133 can be connected end to end to form a closed ring circuit.

For another example, in another optional example, the resonance unit 130 may include multiple inductor elements 131 and one capacitor element 133, may also include one inductor element 131 and multiple capacitor elements 133, and may also include multiple inductor elements 131 and a plurality of capacitor elements 133.

That is to say, the sum of the numbers of the inductor elements 131 and the capacitor elements 133 may be greater than or equal to three. In this way, more than three inductor elements 131 and capacitor elements 133 can be connected end to end to form at least one closed ring circuit.

Based on this, it can be known that when the resonance unit 130 includes at least one inductor element 131 and at least one capacitor element 133, the at least one inductor element 131 and the at least one capacitor element 133 can be connected end to end to form at least one closed ring circuit.

That is to say, based on the different numbers of the inductor elements 131 and the capacitor elements 133, and the different specific manner of the end-to-end connection, the number of ring circuits formed is also different.

Figure 6:
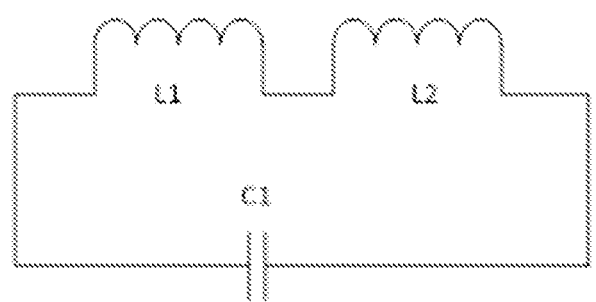
FIG. 6 is a circuit schematic diagram of the resonance unit provided by an embodiment of the present disclosure.

For example, in an optional example, as shown in FIG. 6, the resonance unit 130 may include a first inductor L1, a second inductor L2 and a first capacitor C1, wherein the first inductor L1, the second inductor L2 and the first capacitor C1 can be in sequence connected end to end to form a closed ring circuit.

Figure 7:
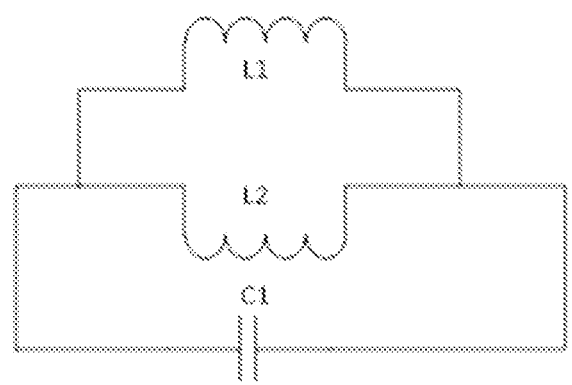
FIG. 7 is another circuit schematic diagram of the resonance unit provided by an embodiment of the present disclosure.

For another example, in another optional example, as shown in FIG. 7, the resonance unit 130 may include a first inductor L1, a second inductor L2 and a first capacitor C1, wherein the first inductor L1, the second inductor L2 and the first capacitor C1 can form three ring circuits, for example, the first inductor L1 and the second inductor L2 form a closed ring circuit, the first inductor L1 and the first capacitor C1 also form a closed ring circuit, and the second inductor L2 and the first capacitor C1 form a closed ring circuit again.

In the above, based on the difference in the number of ring circuits formed by at least one inductor element 131 and at least one capacitor element 133 described above, different connection arrangements can be performed on the first port 111 and the second port 113 to form different numbers of parallel-connected branches.

For example, in an optional example, at least one inductor element 131 and at least one capacitor element 133 are in sequence connected end to end to form a closed ring circuit. In this way, the first port 111 and the second port 113 are connected to different positions of the ring circuit to form two branches connected in parallel.

In the above, in combination with the foregoing examples, the positions in which the first port 111 and the second port 113 are connected to the ring circuit can be selected differently. Based on this, when the resonance unit 130 includes one inductor element 131 and one capacitor element 133, and the inductor element 131 and the capacitor element 133 are connected end to end to form a closed ring circuit, the following two optional examples are respectively provided.

Figure 8:
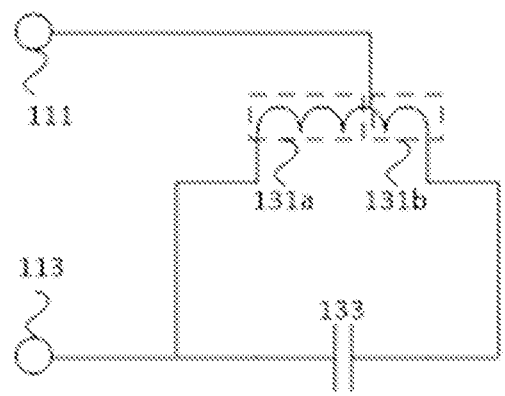
FIG. 8 is a circuit schematic diagram of the port connection of the resonance circuit provided by an embodiment of the present disclosure.

Optionally, as shown in FIG. 8, one of the first port 111 and the second port 113 is not connected to the capacitor element 133. In detail, the inductor element 131 may include adjacent first part 131*a* and second part 131*b*.

In this way, the second port 113 may be connected between the inductor element 131 and the capacitor element 133, and the first port 111 may be connected between the first part 131*a* and the second part 131*b*, so that the first part 131*a* and the second part 131*b* respectively belong to two branches connected in parallel.

That is to say, one of the first part 131a and the second part 131b is connected in series with the capacitor element 133 to form one branch, and the other part may form the other branch.

In the above, in a specific application example, the second port 113 may be connected between the first part 131a and the capacitor element 133, and the first port 111 may be connected between the first part 131a and the second part 131b.

Figure 9:
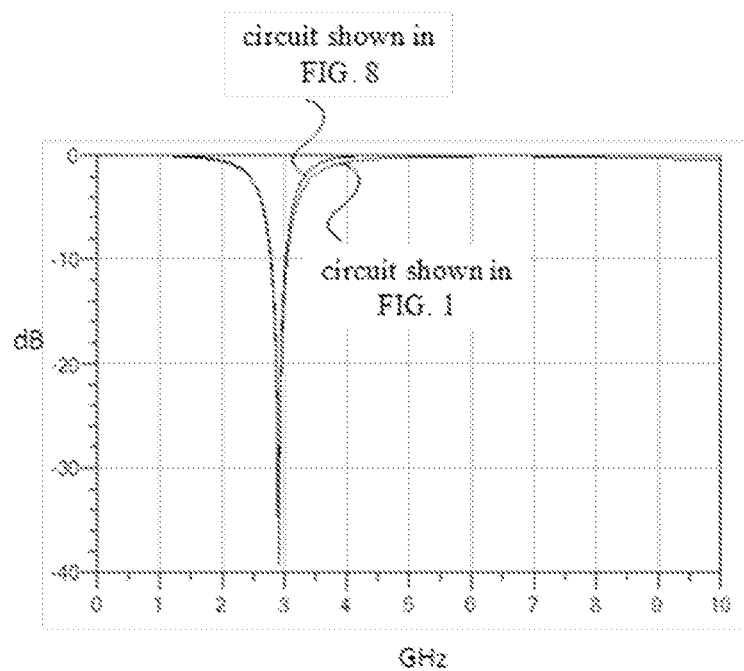
FIG. 9 is a schematic view of the resonance performance curves of the two parallel resonance circuits shown in FIG. 1 and FIG. 8.

Furthermore, in order to obtain the same resonance frequency as that of the circuit shown in FIG. 1, the capacitance value of the capacitor element 133 may be 1 pF (less than 2 pF shown in FIG. 1), the inductance value of the first part 131a may be 2 nH, and the inductance value of the second part 131b may be 1 nH. In this way, by simulating and comparing with the circuit shown in FIG. 1, the resonance performance curve graph shown in FIG. 9 can be obtained.

Based on this, it can be known that the circuit shown in FIG. 8 can used to reduce the capacitance value of the capacitor, and also obtain the resonance performance that is basically the same as that of the circuit shown in FIG. 1, which has the higher out-of-band rejection at the frequency position near the transmission zero point.

Figure 10:
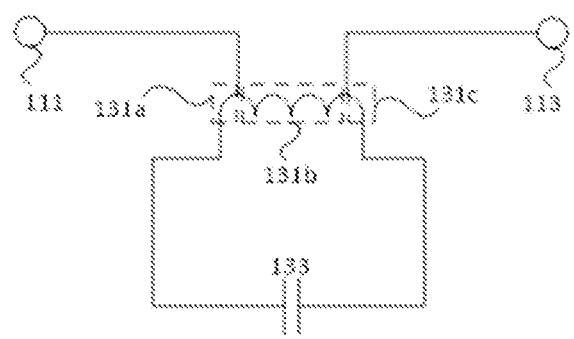
FIG. 10 is a circuit schematic diagram of another port connection of the resonance circuit provided by an embodiment of the present disclosure.

Optionally, as shown in FIG. 10, in the first port 111 and the second port 113, two ports are not connected to the capacitor element 133. In detail, the inductor element 131 may include a first part 131a, a second part 131b and a third part 131c which are adjacent in sequence.

In this way, the first port 111 may be connected between the first part 131a and the second part 131b, and the second port 113 may be connected between the second part 131b and the third part 131c, so that the first part 131a, the capacitor element 133 and the third part 131c are connected in series, which is connected in parallel with the second part 131b.

That is to say, the first part 131a, the capacitor element 133 and the third part 131c are connected in series to form a branch. The second part 131b may form the other branch.

Figure 11:
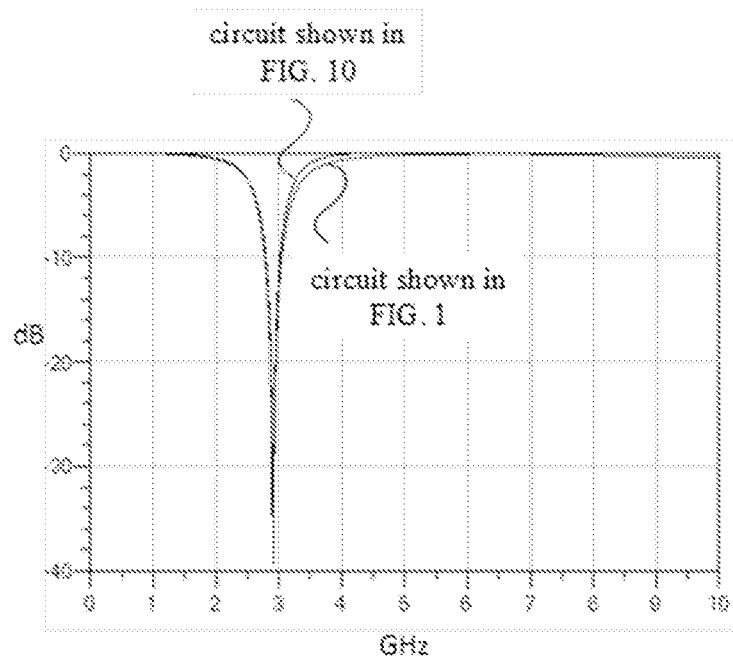
FIG. 11 is a schematic view of the resonance performance curves of the two parallel resonance circuits shown in FIG. 1 and FIG. 10.

In this way, in order to obtain the resonance frequency that is the same as that of the circuit shown in FIG. 1, the capacitance value of the capacitor element 133 may be 1 pF (less than 2 pF shown in FIG. 1), the inductance value of the first part 131a may be 0.5 nH, and the inductance value of the second part 131b may be 2 nH, and the inductance value of the third part 131c may be 0.5 nH. In this way, by simulating and comparing with the circuit shown in FIG. 1, the resonance performance curve graph shown in FIG. 11 can be obtained.

Based on this, it can be known that the circuit shown in FIG. 10 can used to reduce the capacitance value of the capacitor, and also obtain the resonance performance that is basically the same as that of the circuit shown in FIG. 1, which has the higher out-of-band rejection at the frequency position near the transmission zero point.

The embodiments of the present disclosure also provide a filtering device 10. In the above, as shown in FIG. 12, the filtering device 10 may include a plurality of resonance circuits 100 as described above.

In detail, the plurality of resonance circuits 100 may be respectively connected through respective connection ports 110 (such as the above-mentioned first port 111 and second port 113), so as to form the filtering device 10.

In the above, the specific structures of the resonance units 130 included in the plurality of resonance circuits 100 may be different, so as to generate different resonance frequencies respectively, thereby forming a band-pass filter.

Figure 12:
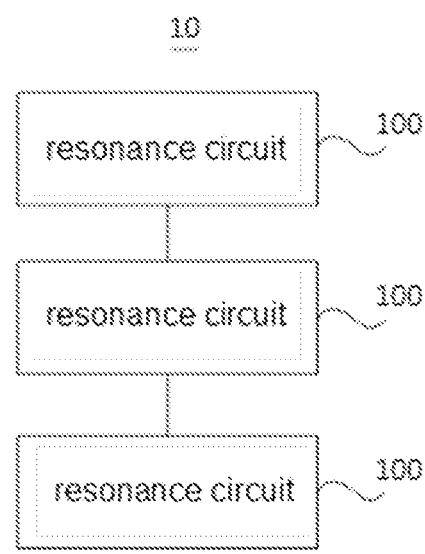
FIG. 12 is a structural block diagram of a filtering device provided by an embodiment of the present disclosure.

It can be understood that, in the example shown in FIG. 12, the plurality of the resonance circuits 100 may be connected in series. Based on other requirements, in other examples, the plurality of the resonance circuits 100 may also be connected in parallel, or in a mixed connection (including series connection and parallel connection).

In addition, in the above-mentioned example, "a plurality of" refers to two or more.

To sum up, in the resonance circuit 100 and the filtering device 10 provided by the present disclosure, by providing at least one port that is not connected to the capacitor element 133, resonance performance of the resonance circuit 100 can be adjusted. In this way, compared with the arrangement in which each of ports is connected to the capacitor element 133 in the prior art, higher out-of-band rejection at the frequency position near the transmission zero point can be obtained under the condition of using capacitors with the same capacitance value and generating the same resonance frequency, or the same out-of-band rejection at the frequency position near the transmission zero point can be obtained under the condition of using capacitors with the less capacitance values and generating the same resonance frequency, thereby solving the problem of the existing resonance circuit that it is difficult to obtain a higher out-of-band rejection at a frequency position near a transmission zero point due to the limitation of the difficulty of making the capacitor larger, and having higher practical value, especially in some miniaturized precision instruments, which can get better application effect.

The above descriptions are only embodiments of the present disclosure, and are not intended to limit the present disclosure, for those skilled in the art, the present disclosure may have various modifications and changes. Any modification, equivalent replacement, improvement, etc. made within the spirit and principle of the present disclosure shall be included within the protection scope of the present disclosure.

INDUSTRIAL APPLICABILITY

In the resonance circuit and filtering device provided by the present disclosure, by providing at least one port that is not connected to the capacitor element, resonance performance of the resonance circuit can be adjusted, thereby solving the problem of the existing resonance circuit that it is difficult to obtain a higher out-of-band rejection at a frequency position near a transmission zero point due to the limitation of the difficulty of making the capacitor larger, which has higher practical value.

What is claimed is:
1. A resonance circuit, comprising:
   a connection port, wherein the connection port comprises a first port and a second port; and
   a resonance unit, wherein the resonance unit comprises at least two inductor elements and at least two capacitor elements, and the at least two inductor elements are connected to the at least two capacitor elements,
   wherein the first port and the second port are respectively connected to the at least two inductor elements, so as to form at least two branches connected in parallel, and each of the first port and the second port is not connected to any capacitor element,
   wherein the at least two inductor elements and the at least two capacitor elements are in sequence connected end to end to form a closed ring circuit, wherein the first port and the second port are connected to different positions of the ring circuit to form the two branches connected in parallel.

2. The resonance circuit according to claim 1, wherein one of the first port and the second port not connected to any capacitor element is connected between two of the at least two inductor elements.

3. The resonance circuit according to claim 1, wherein one of the first port and the second port not connected to any capacitor element is connected between two adjacent different parts of one of the at least two inductor elements, so that the two adjacent different parts respectively belong to the two branches connected in parallel.

4. The resonance circuit according to claim 1, wherein the first port serves as an input port of the resonance circuit, and the second port serves as an output port of the resonance circuit.

5. A filtering device, comprising a plurality of resonance circuits according to claim 1, and the plurality of resonance circuits are respectively connected through the connection port.

6. The filtering device according to claim 5, wherein each of the resonance units has different compositions to respectively generate different resonance frequencies, thereby forming a band-pass filter.

7. The filtering device according to claim 5, wherein the plurality of resonance circuits are connected in series, or in parallel, or both in series and in parallel.

* * * * *